(12) United States Patent
Rothman (10) Patent No.: US 10,608,040 B2
(45) Date of Patent: Mar. 31, 2020

(54) PHOTODETECTION DEVICE WHICH HAS AN INTER-DIODE ARRAY AND IS OVERDOPED BY METAL DIFFUSION AND MANUFACTURING METHOD

(71) Applicant: COMMISSARIAT A L'ENERGIE ATOMIQUE ET AUX ENERGIES ALTERNATIVES, Paris (FR)

(72) Inventor: Johan Rothman, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/777,698

(22) PCT Filed: Nov. 25, 2016

(86) PCT No.: PCT/EP2016/078793
§ 371 (c)(1),
(2) Date: May 21, 2018

(87) PCT Pub. No.: WO2017/089528
PCT Pub. Date: Jun. 1, 2017

(65) Prior Publication Data
US 2018/0337210 A1   Nov. 22, 2018

(30) Foreign Application Priority Data
Nov. 27, 2015  (FR) ...................... 15 61497

(51) Int. Cl.
*H01L 27/146* (2006.01)
*H01L 31/103* (2006.01)
(Continued)

(52) U.S. Cl.
CPC .. *H01L 27/14649* (2013.01); *H01L 27/14685* (2013.01); *H01L 27/14689* (2013.01);
(Continued)

(58) Field of Classification Search
CPC ........... H01L 27/1464; H01L 27/14643; H01L 27/14645; H01L 27/14649;
(Continued)

(56) References Cited

U.S. PATENT DOCUMENTS 4,766,084 A * 8/1988 Bory ................. H01L 21/425
                                                            204/192.32
4,972,244 A * 11/1990 Buffet ............... H01L 27/1446
                                                              257/442
(Continued)

FOREIGN PATENT DOCUMENTS

EP       0 262 030 A1    3/1988
EP       0 350 351 A1    1/1990
(Continued)

OTHER PUBLICATIONS

International Search Report dated Feb. 21, 2017 in PCT/EP2016/078793 filed Nov. 25, 2016.
(Continued)

*Primary Examiner* — Matthew E Warren
(74) *Attorney, Agent, or Firm* — Oblon, McClelland, Maier & Neustadt, L.L.P.

(57) ABSTRACT

A photodetection device and a method for manufacturing the device, the device including a substrate and an array of diodes, the substrate including an absorption layer including a first type of doping, and each diode including, in the absorption layer, a collection region including a second type of doping opposite to the first type. The device further includes, under the surface of the substrate, a conductive mesh including at least one conductive channel inserted between the collection regions of two adjacent diodes, the at least one conductive channel including the first type of doping and a higher doping density than the absorption layer. The doping density of the at least one conductive channel is the result of a diffusion of metal in the absorption (Continued)

layer from a metal mesh provided on the surface of the substrate.

10 Claims, 5 Drawing Sheets

(51) Int. Cl.
| | | |
|---|---|---|
| *H01L 31/0296* | (2006.01) | |
| *H01L 31/18* | (2006.01) | |
| *H01L 31/0224* | (2006.01) | |
| *H01L 31/02* | (2006.01) | |
| *H01L 31/0216* | (2014.01) | |
| *H01L 31/0352* | (2006.01) | |

(52) U.S. Cl.
CPC .. *H01L 31/02005* (2013.01); *H01L 31/02161* (2013.01); *H01L 31/02963* (2013.01); *H01L 31/02966* (2013.01); *H01L 31/022408* (2013.01); *H01L 31/035272* (2013.01); *H01L 31/1032* (2013.01); *H01L 31/1832* (2013.01); *H01L 31/1864* (2013.01); *H01L 31/1868* (2013.01)

(58) Field of Classification Search
CPC ......... H01L 31/02963; H01L 31/02966; H01L 31/1032; H01L 31/1832; H01L 31/1864; H01L 31/1868

USPC .................................................. 257/441–443
See application file for complete search history.

(56) References Cited

U.S. PATENT DOCUMENTS

| | | | |
|---|---|---|---|
| 5,177,580 A | | 1/1993 | Norton et al. |
| 5,602,414 A | * | 2/1997 | Mitsui ............... H01L 27/14649 257/442 |
| 2007/0090394 A1 | * | 4/2007 | Bui ..................... H01L 27/1446 257/127 |
| 2010/0213565 A1 | * | 8/2010 | Bui ..................... H01L 27/1446 257/447 |
| 2014/0339570 A1 | | 11/2014 | Mollard et al. |

FOREIGN PATENT DOCUMENTS

| | | |
|---|---|---|
| EP | 2 806 427 A2 | 11/2014 |
| FR | 2 983 347 A1 | 5/2013 |

OTHER PUBLICATIONS

Preliminary French Search Report dated Aug. 11, 2016 in French Application 1561497 filed Nov. 27, 2015.

* cited by examiner

PHOTODETECTION DEVICE WHICH HAS AN INTER-DIODE ARRAY AND IS OVERDOPED BY METAL DIFFUSION AND MANUFACTURING METHOD

TECHNICAL FIELD

The field of the invention is that of photodetectors comprising an array of diodes, such as a matrix array, manufactured on a semi-conductor substrate. The invention is more precisely concerned with p/n- or n/p-type diodes which can be used for visible or infrared imagers.

STATE OF PRIOR ART

In many photodetection applications, diodes are arranged as matrices of diodes on a substrate. In a matrix, the diodes are arranged in rows and columns. A matrix of diode can be used to enable an electromagnetic radiation to be detected. Indeed, electron-hole pairs can be formed by interaction between the electromagnetic radiation and the substrate. This enables a current proportional to an intensity of the incident radiation to appear. Each diode thereby forms a pixel of a photodetector.

By coupling the matrix of diodes with an electronic read circuit, it is thus possible to sense the spatio-temporal variation of light intensity on the photodetector. The sensitivity of such a photodetector is given by its ability to reflect small spatial or temporal variations of light intensity into a usable compared signal in spite of random variations (noise) resulting from thermal and electrical phenomena in the diodes and in the read circuit.

Figure 1A:
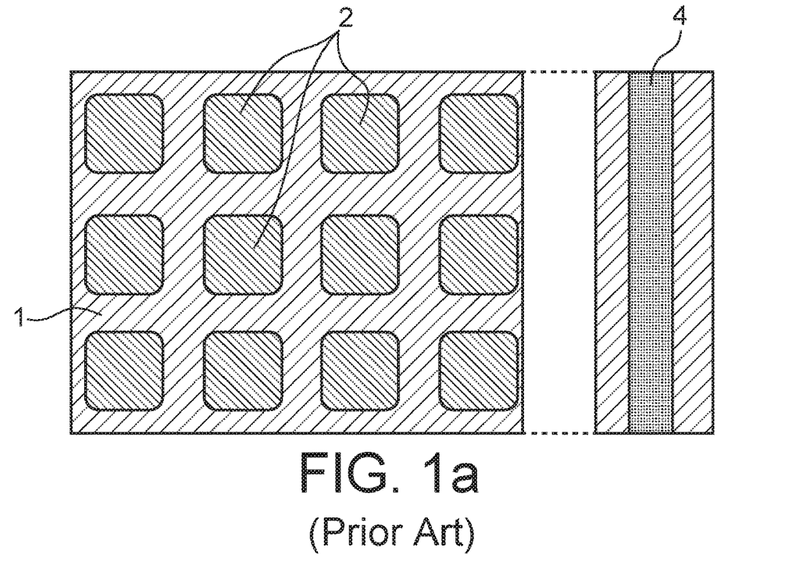
Figure 1B:
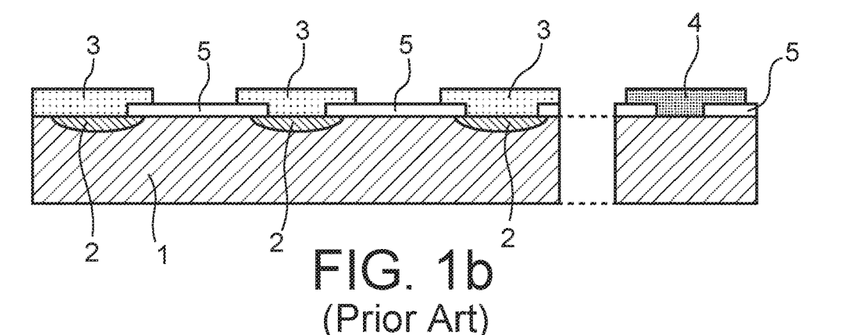

Such a matrix of diodes is illustrated in FIGS. 1a and 1b which respectively represent a top view and a cross-section view along a row of the matrix. A diode is formed in a substrate having an absorption layer 1 of a semi-conductor material with a forbidden energy gap and characterized by a type of conductivity. The diode comprises a collection region 2 of an opposite type of conductivity, thus forming a p-n junction.

As illustrated in FIG. 1b, each collection region is in contact with a metallic bump contact 3 forming a diode contact. A metal region 4, formed at the periphery of the matrix, is in contact with the substrate, and forms a substrate contact. Both regions of opposite type 1, 2 of conductivity are protected from a degradation in their chemical, mechanical, and electronic properties by means of a passivation layer 5 covering the surface of the substrate except for the diode contact and substrate contact zones.

In the region in the proximity of the interface of both regions of opposite type 1, 2 of conductivity, a so-called space charge region (SCR) is formed. This zone is characterized by the presence of an energy barrier for majority carriers on each side of the junction. Photons arriving in the absorption layer 1 of the semi-conductor substrate can give their energy to one electron. If the electron passes between the valence band and the conduction band and is moved up to the space charge region, the charge will be collected by the collection region 2. The charges thus collected can be transferred to an electronic circuit, called a read circuit, connected to each diode to have a usable signal available. The charge drawing is compensated for by a call for charge by the substrate contact which is, in the case generally used in the state of the art, common for all diodes.

Upon detecting a high photon flux, each diode outputs a high charge flux, i.e. electric current, proportional to the photon flux arriving in the proximity of the diode. The currents of all the diodes are added through the substrate up to the substrate contact. In the presence of an electric resistance in the substrate, the current in the same can strongly influence the operation of the diodes.

This electric resistance can thus induce a bias variation which affects the operation of the diodes. In the extreme case, it can cause a charge transfer cancellation between the diodes and the read circuit by removing the potential barrier in the junctions. This phenomenon is all the more significant that the number of diodes and the photon flux on the matrix are significant.

This electric resistance can beside strongly slowdown charge transfer in the read circuit, even in the presence of a small flux, because of a collective RC effect.

Besides, controlling the interface state between the passivation layer 5 and the semi-conducting regions 1, 2 is crucial to achieve a maximum sensitivity. This is due to faults which can be present at the interface, but also to states in the passivation which act as traps for charges. Faults at the interface can thus act as centres for generating/recombining carriers which decrease the photon signal and increase the contribution of the thermal or electric induced current generated in the substrate and/or in the junction. Trap states in the passivation are in turn likely to vary temporally the local charge density in the proximity of each trap. These fluctuations can in turn generate fluctuations in the photon current and in the different dark currents.

Generally, it is therefore attempted to reduce the collective series resistance effect and to stabilize performance of diodes in order to increase the photodetector sensitivity.

Figure 2:
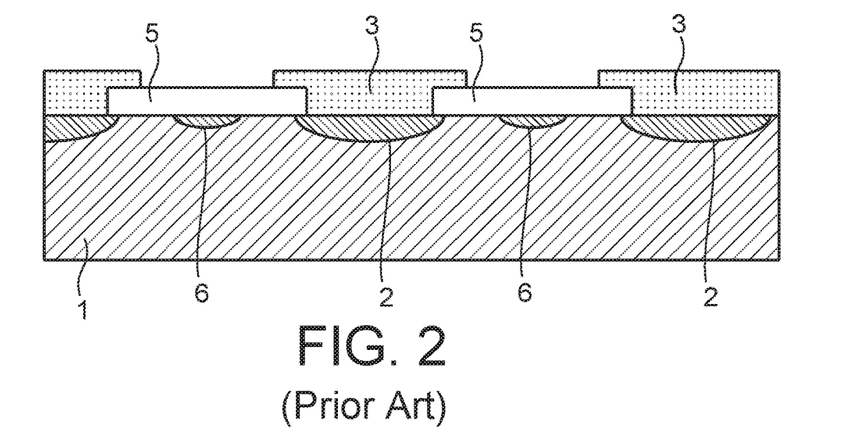

From patent application EP 2 806 457 A2, a solution is known consisting in making an overdoping array between the diodes in order to stabilize the interface between the substrate and the passivation layer. This solution is represented in FIG. 2. It consists in forming buried conductive rows 6 which extend between the columns and between the rows of diodes in the matrix. These buried rows 6 are more precisely rows doped by ion implantation with the same doping type as the absorption layer 1, and a higher doping density.

From patent application EP 0 350 351 A1, an array of diodes is known with a mesa structure which are separated by trenches machined in a substrate. A metal layer is deposited into the bottom of each trench, and a heat treatment is performed which causes a metal diffusion into the absorption layer from the metal layer and forms an overdoped region under each trench. Machining trenches however creates faults, and heat treatment should enable them to be removed while enabling the p-doping level to be set and metal diffusion to be made. However, faults persist, and it is not possible to make a good-quality ohmic contact in the bottom of the trenches.

DISCLOSURE OF THE INVENTION

One purpose of the invention is to improve the sensitivity of photodetectors with an array of diodes. For this, it provides a photodetection device including a substrate and an array of diodes, the substrate comprising a front face for receiving an electromagnetic radiation, a rear face opposite and substantially parallel to the front face, and an absorption layer having a first doping type. Each diode includes in the absorption layer a collection region which is flush with the rear face of the substrate and has a second doping type opposite to the first type. The device includes, buried in the substrate and being flush with the rear face of the substrate, a conduction meshing comprising at least one conduction channel sandwiched between the collection regions of two adjacent diodes, the at least one conduction channel having the first doping type and a higher doping density than the absorption layer. The conduction meshing is covered with a metallic meshing present on the rear face of the substrate and the doping density of the at least one conduction channel results from a metal diffusion in the absorption layer from the metallic meshing.

Some preferred but non-limiting aspects of this device are the following ones:

- it comprises a peripheral substrate contact arranged on at least one side of the array of diodes;
- the metallic meshing is in electric contact with the peripheral substrate contact;
- the conduction meshing has a plurality of conduction channels arranged such that there is a conduction channel sandwiched between the collection regions of each of the adjacent diodes of the array of diodes;
- a passivation layer covers the substrate except for contact regions of an electrically conductive bump with a collection region of a diode;
- the absorption layer is a layer of CdHgTe;
- the absorption layer has an intrinsic doping by mercury vacancies or an extrinsic doping by arsenic incorporation;
- the absorption layer has a gradual bandgap increase from the rear face of the substrate in the thickness of the absorption layer;
- the absorption layer has an abrupt bandgap decrease which appears at a given depth in the thickness of the absorption layer from the rear face of the substrate, and which delimits a region having a higher bandgap in the proximity of the rear face in which there is the conduction meshing, and a region having a lower bandgap away from the rear face of the substrate.

The invention is also concerned with a method for manufacturing such a photodetection device. This method comprises in particular forming a metallic meshing on the rear face of the substrate, the formation of the conduction meshing being made by metal diffusion from the metallic meshing.

BRIEF DESCRIPTION OF THE DRAWINGS

Further aspects, purposes, advantages and characteristics of the invention will better appear upon reading the following detailed description of preferred embodiments thereof, given by way of non-limiting example, and made in reference to the appended drawings in which, in addition to FIGS. 1a, 1b and 2 already described.

DETAILED DISCLOSURE OF PARTICULAR EMBODIMENTS

Figure 3A:
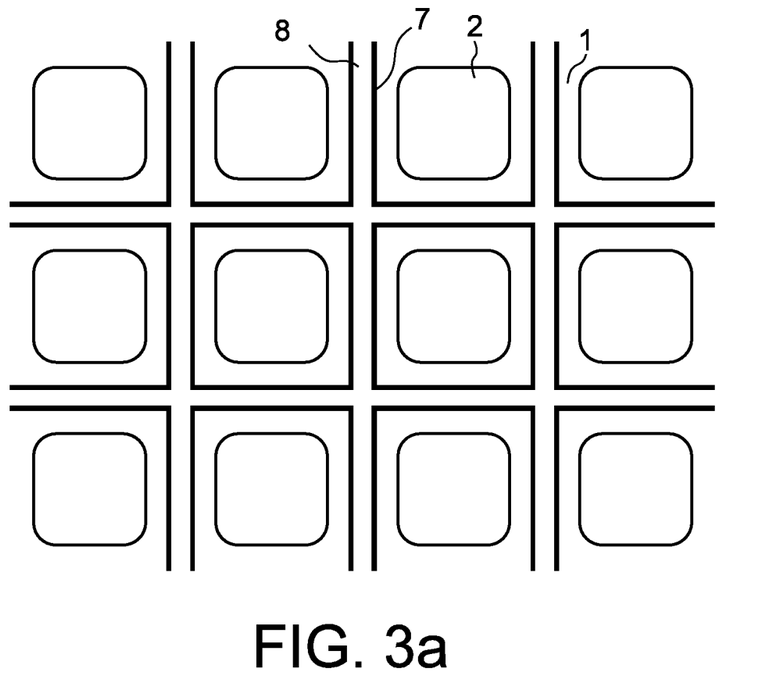
FIGS. 3a and 3b are respectively a top view and a cross-section view along a row of diodes of a matrix of diodes in accordance with the invention.
Figure 3B:
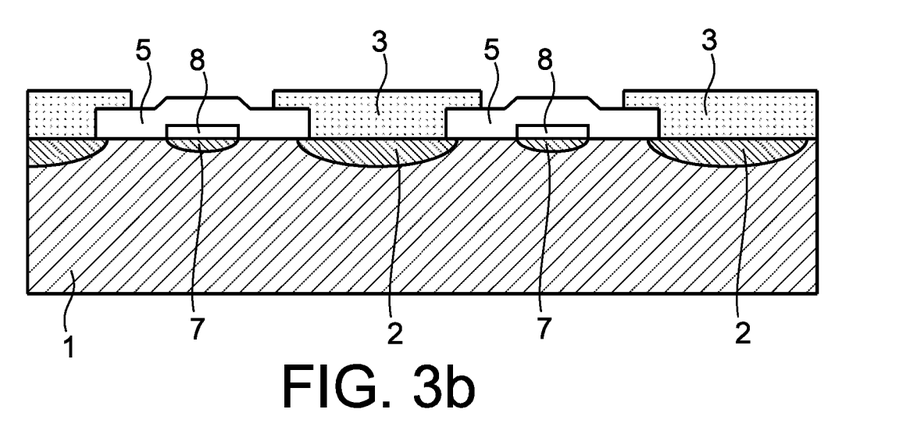

In reference to FIGS. 3a and 3b, the invention is concerned with a photodetection device including a substrate and an array of diodes. The substrate comprises a front face for receiving an electromagnetic radiation and a rear face opposite to the front face and substantially parallel to the same. The substrate also comprises an absorption layer 1 having a first doping type, each diode includes in the absorption layer 1 a collection region 2 which is flush with the rear face of the substrate and has a second doping type opposite to the first type.

The absorption layer 1 is for example a layer of CdHgTe. Such a layer can in particular be formed by epitaxy on a substrate of CdZnTe. Its cadmium composition can be between 20 and 40%. Its thickness is for example 8 μm.

The doping of the absorption layer 1 can be of the p-type. It can be an intrinsic doping by mercury vacancies or an extrinsic doping, for example by arsenic incorporation. The doping density of the absorption layer is typically between $10^{15}$ and $10^{17}$ at/cm$^3$.

Doping of the collection region 2 is thereby of the n-type. This doping can be achieved by ion implantation, for example boron implantation.

Of course, the invention is applicable to the case of a n-type doping of the absorption layer 1, for example by indium incorporation, and a p-type doping of the collection region 2, obtained for example by arsenic implantation.

The device according to the invention further comprises, under the surface of the substrate at which the collection regions are made (by surface of the substrate, it is meant the rear face of the substrate opposite to the front face receiving the electromagnetic radiation), a conduction meshing comprising at least one conduction channel 7 sandwiched between the collection regions of two adjacent diodes. The at least one conduction channel 7 has the first doping type and a higher doping density than the absorption layer. The doping density of the at least one conduction channel is typically between $10^{16}$ and $10^{18}$ at/cm$^3$.

The conduction meshing is buried in the substrate and is flush with the rear face of the substrate. Different topologies of conduction meshing can be implemented within the scope of the invention. Preferably, this conduction meshing has at least one conduction channel which extends between two adjacent lines of diodes. In other words, this canal extends between two adjacent rows or two adjacent columns of diodes.

The conduction meshing has preferably a plurality of conduction channels which extend each between two adjacent lines (rows or columns) of diodes. In particular, a plurality of conduction channels arranged such that there is a conduction channel sandwiched between the collection regions of each of the adjacent diodes of the array of diodes can be provided. In other words, and as is represented in FIG. 3a in the case of a matrix array of diodes, each diode is separated from its adjacent diodes by four conduction channels which interleave each other.

Within the scope of the invention, the doping density of the at least one conduction channel 7 results from a metal diffusion in the absorption layer. The metal is for example gold or copper when the aim is to make a p-type doping of the conduction meshing 7. The metal is for example indium when the aim is to make an n-type doping of the conduction meshing 7.

The diffused metal comes to be placed in a substitution site in the crystal lattice of the semi-conductor by creating donor or acceptor states resulting in overdoping. Metal diffusion is preferably made by heat treatment.

In addition to stabilize the interface between the semi-conductor and the passivation layer in the same way as in patent application EP 2 806 457 A2, forming the highly doped conduction meshing by metal diffusion enables the formation of faults to be reduced with respect to making the highly doped region by ion implantation as proposed in application EP 2 806 457 A2. This reduction in the fault formation results in an improvement of the performance of diodes with a reduction in the dark current and in the number of diodes with noise fault.

Metal diffusion is made from a metallic meshing 8 directly present on the surface of the substrate, for example a gold, copper or indium meshing. This metallic meshing 8 thus directly and wholly covers the conduction meshing 7. It is thereby distributed on the surface of the substrate according to the same pattern as the overdoped conduction meshing.

The metallic meshing 8 forms an ohmic contact with the substrate in which the current is directly conducted. Thus, the presence of this metallic meshing advantageously brings about a strong reduction in the serial access resistance, and thus of the collective depolarization and RC effects.

The device according to the invention further includes a peripheral substrate contact arranged on at least one side of the array of diodes. This contact is not represented in FIGS. 3a and 3b but is similar to what is previously discussed in connection with FIGS. 1a and 1b. Such a peripheral substrate contact enables an electrical connection to be made between the substrate and the read circuit on the periphery of the array of diodes thus releasing space between the diodes, and advantageously enabling an array of diodes to be made with a small pitch between the diodes.

The conduction meshing 7 is preferably in electric contact with the peripheral substrate contact, in particular through the metallic meshing 8.

The device according to the invention further includes a passivation layer 5 which covers the substrate except for contact regions of an electrically conductive bump contact 3 with a collection region 2 of a diode, and optionally a peripheral contact region of an electrically conductive stud with the substrate.

Figure 4A:
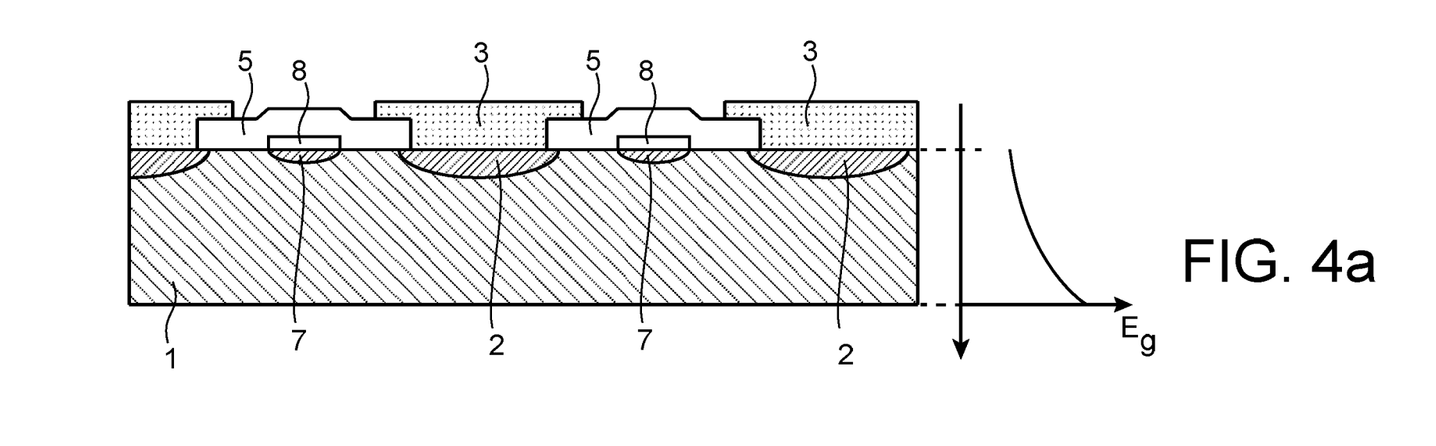
FIGS. 4a and 4b illustrate alternative embodiments of the invention with a bandgap variation in the thickness of the absorption layer.
Figure 4B:
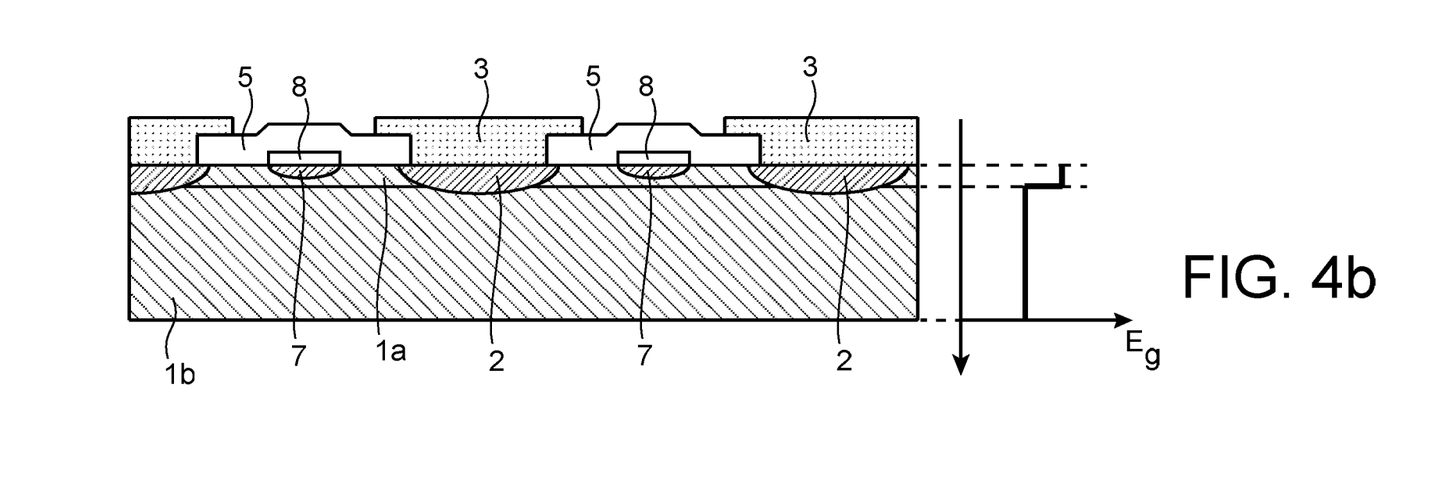

In alternative embodiments represented in FIGS. 4a and 4b, the absorption layer has a bandgap (forbidden energy gap) variation Eg from the surface of the substrate in the thickness of the absorption layer. With an absorption layer of CdHgTe for example, this bandgap variation can be achieved by varying the cadmium content.

In FIG. 4a, the absorption layer 1 has a gradual bandgap increase from the surface of the substrate in the thickness of the absorption layer. This alternative enables diffusion of minority carriers between the diodes to be limited because of an increase in the probability of collecting charges in the pixel where they have been photo-generated. Therefore, it enables the spread of the response on the neighbor pixels to be decreased. This alternative is advantageously used in the case of a detection array with a small pitch.

In FIG. 4b, the absorption layer has an abrupt bandgap decrease which appears at a given depth in the thickness of the absorption layer from the surface of the substrate. The absorption layer thereby consists of two regions 1a, 1b with a different energy bandgap value, that is a region 1a with a high bandgap immediately under the passivation layer and a low-bandgap region 1b. The extend of the high-bandgap region 1a is such that there is the conduction meshing 7 in this region 1a. The collection regions 2 preferably in turn project from the region 1a, or extent at least in the region 1a up to be adjacent with the bandgap change interface between the regions 1a and 1b. The presence of the high-bandgap region 1a enables possibly detrimental effects related to faults induced by the formation of this region immediately under the surface of the substrate to be limited.

The invention is not limited to the photodetection device previously described, but is also applicable to a method for manufacturing a photodetection device including a substrate and an array of diodes, the substrate comprising an absorption layer 1 having a first doping type and each diode including in the absorption layer 1 a collection region 2 which has a second doping type opposite to the first type. The method comprises a step of forming a conduction meshing 7 buried in the substrate and being flush with the rear face of the substrate. The conduction meshing 7 comprises at least one conduction channel sandwiched between the collection regions of two adjacent diodes, the at least one conduction channel having the first doping type and a higher doping density than in the absorption layer. Within the scope of the invention, the formation of a metallic meshing is conducted on the rear face of the substrate and said step of forming the conduction meshing is made by metal diffusion from the metallic meshing at the surface of the substrate.

Figure 5A:
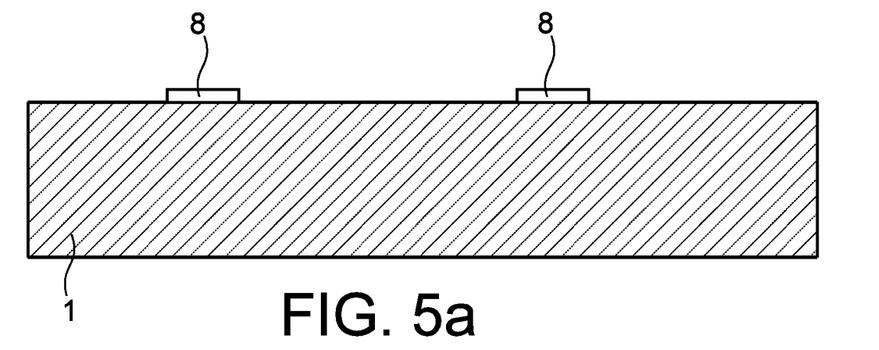
FIGS. 5a-5f illustrate a possible embodiment of a method for manufacturing a photodetection device in accordance with the invention.
Figure 5B:
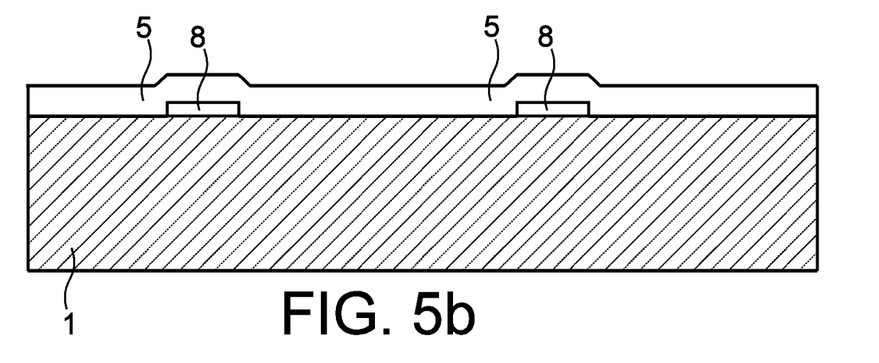
Figure 5C:
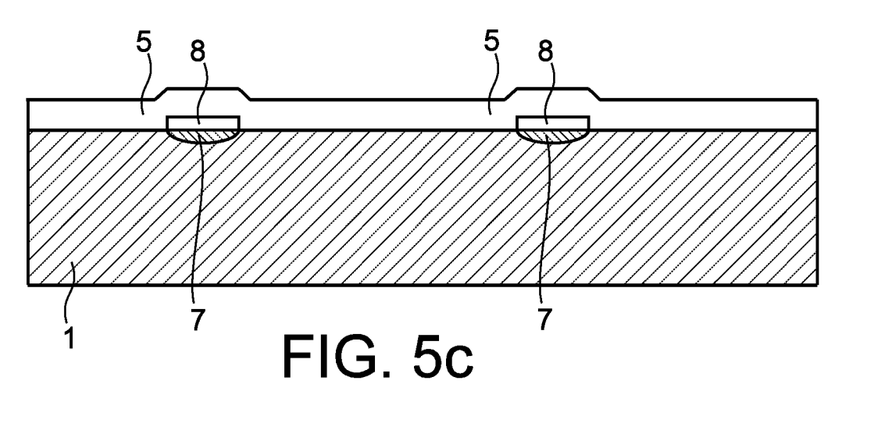

FIGS. 5a-5f illustrate an exemplary embodiment of such a method which starts with a step of providing a substrate carrying the absorption layer 1, for example of CdHgTe. After the surface of the substrate is prepared, as represented in FIG. 5a, a deposition of the metallic meshing 8 on the surface of the substrate is conducted. The metallic meshing comprises for example several rows having a width of 1 µm and a thickness of 500 nm. FIG. 5b illustrates the deposition of a passivation layer 5 onto the substrate and the metallic meshing. Then, an annealing operation for stabilizing the interface between the substrate and the passivation layer is conducted. This annealing operation enables metal diffusion of the metallic meshing towards the substrate, resulting as represented in FIG. 5c, in the formation of the conduction meshing 7 in the substrate directly underneath the metallic meshing 8 at the surface of the substrate. When the passivation layer is deposited before metal diffusion, it acts as a barrier to Hg evaporation from the absorption layer and a simple annealing operation under vacuum can be used. The passivation layer can however be deposited thereafter, wherein an annealing operation under Hg saturation vapour pressure can thereby be implemented.

Figure 5D:
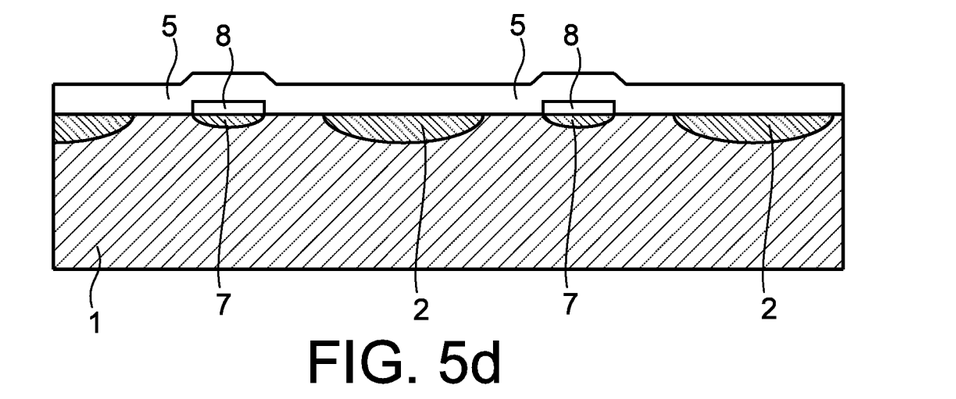

In reference to FIG. 5d, the formation of the collection regions 2 are then conducted by means of an ion implantation through a suitable mask. The diameter of each collection region is for example between 5 and 20 µm, and these regions are spaced apart by a pixel pitch for example between 5 and 30 µm.

Figure 5E:
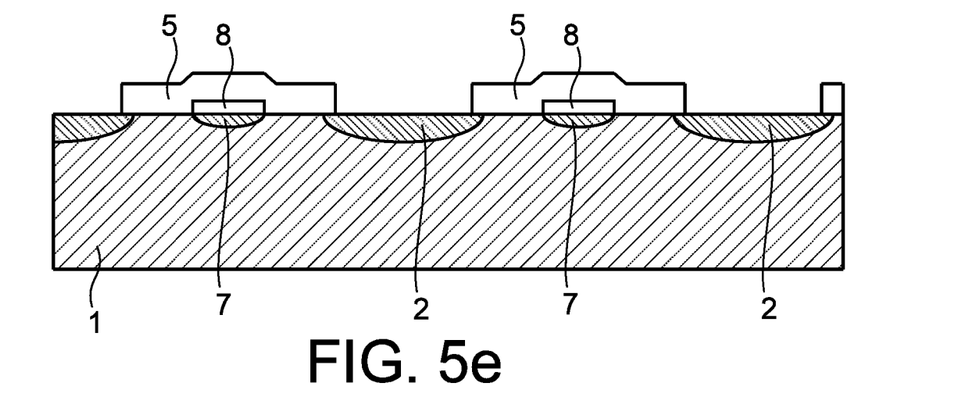

As represented in FIG. 5e, the opening of the passivation layer 5 is then conducted at each pixel, as well as in the array periphery for the subsequent formation of the substrate contact.

Figure 5F:
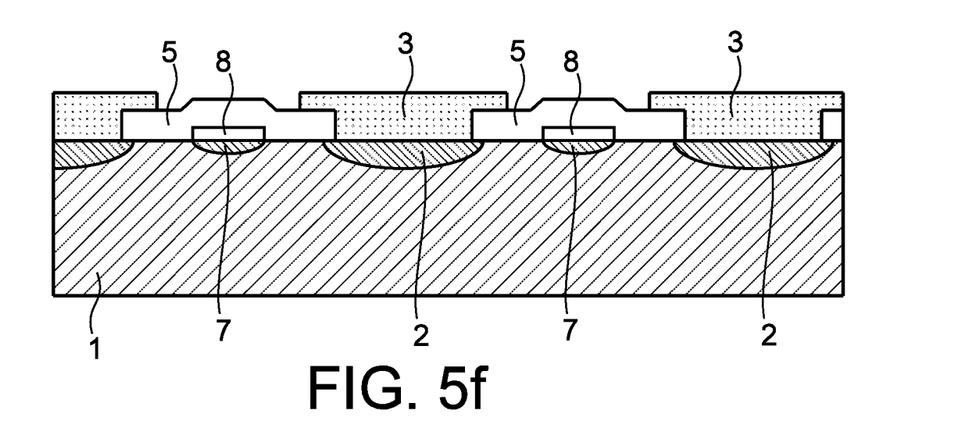

As represented in FIG. 5f, the deposition of a metal layer and the etching thereof at each pixel and at the periphery are then conducted to form the diode contacts 3 and the substrate contact. The thickness of these contacts is typically lower than 1 µm.

The invention is advantageously applicable to infrared imaging, and in particular full size imaging where it enables the depolarization effect to be reduced in case of high flux, to active imaging where it enables the depolarization effect and slowing-down caused by the collective RC effect to be reduced, as well as to very low pitch imaging where it enables the interface between the diodes to be stabilized and the modulation transfer function of the photodetector to be increased.

The invention claimed is:

1. A method for manufacturing a photodetection device including a substrate and an array of diodes, the substrate including a front face for receiving an electromagnetic radiation, a rear face opposite to and substantially parallel to the front face and an absorption layer having a first doping type, each diode including in the absorption layer a collection region being flush with the rear face of the substrate and having a second doping type opposite to the first type, the method comprising:

forming, buried in the substrate and being flush with the rear face of the substrate, a conduction meshing which comprises at least one conduction channel sandwiched between the collection regions of two adjacent diodes, the at least one conduction channel having the first doping type and a higher doping density than in the absorption layer;

forming a metallic meshing comprising at least one metallic row on the rear face of the substrate, wherein the forming the conduction meshing is made by metal diffusion from the metallic meshing; and after forming the metallic meshing, depositing a passivation layer onto the substrate and the metallic meshing, wherein the forming the conduction meshing is made during an annealing for stabilizing an interface between the substrate and the passivation layer.

2. The method according to claim 1, further comprising providing a peripheral substrate contact arranged on at least one side of the array of diodes.

3. The method according to claim 2, wherein the metallic meshing is in electric contact with the peripheral substrate contact.

4. The method according to claim 3, wherein the conduction meshing includes at least one conduction channel extending between two adjacent lines of diodes.

5. The method according to claim 4, wherein the conduction meshing includes a plurality of conduction channels arranged such that there is a conduction channel sandwiched between the collection regions of each of the adjacent diodes of the array of diodes.

6. The method according to claim 1, wherein the passivation layer covers the substrate except for contact regions of an electrically conductive bump with a collection region of a diode.

7. The method according to claim 1, wherein the absorption layer is a layer of CdHgTe.

8. The method according to claim 1, wherein the absorption layer includes an intrinsic doping by mercury vacancies or an extrinsic doping by arsenic incorporation.

9. The method according to claim 1, wherein the absorption layer includes a gradual bandgap increase from the rear face of the substrate in the thickness of the absorption layer.

10. The method according to claim 1, wherein the absorption layer includes an abrupt bandgap decrease, which appears at a given depth in thickness of the absorption layer from the rear face of the substrate, and which delimits a first region having a lower bandgap in proximity of the rear face of the substrate in which there is the conduction meshing, and a second region having a lower bandgap away from the rear face of the substrate.

* * * * *